(12) United States Patent
Silverbrook

(10) Patent No.: US 7,950,777 B2
(45) Date of Patent: *May 31, 2011

(54) EJECTION NOZZLE ASSEMBLY

(75) Inventor: Kia Silverbrook, Balmain (AU)

(73) Assignee: Silverbrook Research Pty Ltd, Balmain, New South Wales (AU)

(*) Notice: Subject to any disclaimer, the term of this patent is extended or adjusted under 35 U.S.C. 154(b) by 0 days.

This patent is subject to a terminal disclaimer.

(21) Appl. No.: 12/857,357

(22) Filed: Aug. 16, 2010

(65) Prior Publication Data

US 2010/0309261 A1    Dec. 9, 2010

Related U.S. Application Data

(63) Continuation of application No. 12/368,997, filed on Feb. 11, 2009, now Pat. No. 7,780,269, which is a continuation of application No. 11/707,039, filed on Feb. 16, 2007, now Pat. No. 7,506,969, which is a continuation of application No. 11/484,745, filed on Jul. 12, 2006, now Pat. No. 7,195,339, which is a continuation of application No. 11/185,721, filed on Jul. 21, 2005, now Pat. No. 7,083,263, which is a continuation of application No. 10/713,084, filed on Nov. 17, 2003, now Pat. No. 7,066,574, which is a continuation of application No. 10/401,987, filed on Mar. 31, 2003, now Pat. No. 6,663,225, which is a continuation of application No. 09/864,332, filed on May 25, 2001, now Pat. No. 6,540,331, which is a continuation-in-part of application No. 09/112,767, filed on Jul. 10, 1998, now Pat. No. 6,416,167.

(30) Foreign Application Priority Data

Jul. 15, 1997    (AU) .................................... PO7991
Mar. 25, 1998    (AU) .................................... PP2592

(51) Int. Cl.
*B41J 2/05* (2006.01)
(52) U.S. Cl. ......................................................... 347/56
(58) Field of Classification Search .................... 347/47, 347/54, 56, 65
See application file for complete search history.

(56) References Cited

U.S. PATENT DOCUMENTS 1,941,001 A    12/1933    Hansell
1,983,690 A    12/1934    Behrens
(Continued)

FOREIGN PATENT DOCUMENTS

DE    1648322 A    3/1971
(Continued)

OTHER PUBLICATIONS

Ataka, Manabu et al, "Fabrication and Operation of Polymide Bimorph Actuators for Ciliary Motion System". Journal of Microelectromechanical Systems, US, IEEE Inc, New York, vol. 2, No. 4, Dec. 1, 1993, pp. 146-150, XP000443412, ISSN: 1057-7157.
Egawa et al., "Micro-Electro Mechanical Systems" IEEE Catalog No. 90CH2832-4, Feb. 1990, pp. 166-171.
Hirata et al., "An Ink-jet Head Using Diaphragm Microactuator" Sharp Corporation, Jun. 1996, pp. 418-423.

(Continued)

*Primary Examiner* — An H Do

(57) ABSTRACT

An ejection nozzle assembly is provided having a substrate defining a fluid supply passage, drive circuitry on the substrate, a chamber on the drive circuitry and in fluid communication with the fluid supply passage and an ejection port, an ejection member disposed between the fluid supply passage and the ejection port, and a heater element electrically coupled to the drive circuitry and the ejection member for causing ejection of fluid from the ejection port.

4 Claims, 2 Drawing Sheets

U.S. PATENT DOCUMENTS

| | | |
|---|---|---|
| 3,294,212 A | 12/1966 | King et al. |
| 3,371,437 A | 3/1968 | Sweet et al. |
| 3,596,275 A | 7/1971 | Sweet |
| 3,683,212 A | 8/1972 | Zoltan |
| 3,747,120 A | 7/1973 | Zoltan |
| 3,946,398 A | 3/1976 | Kyser et al. |
| 4,007,464 A | 2/1977 | Bassous et al. |
| 4,053,807 A | 10/1977 | Aozuka et al. |
| 4,097,873 A | 6/1978 | Martin |
| 4,111,124 A | 9/1978 | Pascale et al. |
| 4,225,251 A | 9/1980 | Klimek et al. |
| 4,370,662 A | 1/1983 | Hou et al. |
| 4,372,694 A | 2/1983 | Bovio et al. |
| 4,388,343 A | 6/1983 | Voss et al. |
| 4,423,401 A | 12/1983 | Mueller |
| 4,456,804 A | 6/1984 | Lasky et al. |
| 4,458,255 A | 7/1984 | Giles |
| 4,459,601 A | 7/1984 | Howkins |
| 4,480,259 A | 10/1984 | Kruger et al. |
| 4,490,728 A | 12/1984 | Vaught et al. |
| 4,535,339 A | 8/1985 | Horike et al. |
| 4,550,326 A | 10/1985 | Allen et al. |
| 4,553,393 A | 11/1985 | Ruoff |
| 4,575,619 A | 3/1986 | Porzky |
| 4,580,148 A | 4/1986 | Domoto et al. |
| 4,584,590 A | 4/1986 | Fischbeck et al. |
| 4,611,219 A | 9/1986 | Sugitani et al. |
| 4,612,554 A | 9/1986 | Poleshuk |
| 4,623,965 A | 11/1986 | Wing |
| 4,628,816 A | 12/1986 | Six |
| 4,665,307 A | 5/1987 | McWilliams |
| 4,672,398 A | 6/1987 | Kuwabara |
| 4,694,308 A | 9/1987 | Chan et al. |
| 4,696,319 A | 9/1987 | Gant |
| 4,706,095 A | 11/1987 | Ono et al. |
| 4,725,157 A | 2/1988 | Nakai et al. |
| 4,728,392 A | 3/1988 | Miura et al. |
| 4,733,823 A | 3/1988 | Waggener |
| 4,737,802 A | 4/1988 | Mielke |
| 4,746,935 A | 5/1988 | Allen |
| 4,751,527 A | 6/1988 | Oda |
| 4,764,041 A | 8/1988 | Bierhoff |
| 4,784,721 A | 11/1988 | Holmen et al. |
| 4,812,792 A | 3/1989 | Leibowitz |
| 4,855,567 A | 8/1989 | Mueller |
| 4,864,824 A | 9/1989 | Gabriel et al. |
| 4,870,433 A | 9/1989 | Campbell et al. |
| 4,887,098 A | 12/1989 | Hawkins et al. |
| 4,894,664 A | 1/1990 | Tsung Pan |
| 4,899,180 A | 2/1990 | Elhatem et al. |
| 4,914,562 A | 4/1990 | Abe et al. |
| 4,952,950 A | 8/1990 | Bibl et al. |
| 4,961,821 A | 10/1990 | Drake et al. |
| 4,962,391 A | 10/1990 | Kitahara et al. |
| 5,016,023 A | 5/1991 | Chan et al. |
| 5,029,805 A | 7/1991 | Albarda et al. |
| 5,048,983 A | 9/1991 | Fukae |
| 5,051,761 A | 9/1991 | Fisher et al. |
| 5,057,854 A | 10/1991 | Pond et al. |
| 5,058,856 A | 10/1991 | Gordon et al. |
| 5,059,989 A | 10/1991 | Eldridge et al. |
| 5,072,241 A | 12/1991 | Shibaike et al. |
| 5,107,276 A | 4/1992 | Kneezel et al. |
| 5,113,204 A | 5/1992 | Miyazawa et al. |
| 5,115,374 A | 5/1992 | Hongoh |
| 5,148,194 A | 9/1992 | Asai et al. |
| 5,184,907 A | 2/1993 | Hamada et al. |
| 5,188,464 A | 2/1993 | Aaron |
| 5,189,473 A | 2/1993 | Negoro et al. |
| 5,198,836 A | 3/1993 | Saito et al. |
| 5,211,806 A | 5/1993 | Wong et al. |
| 5,218,754 A | 6/1993 | Rangappan |
| 5,245,364 A | 9/1993 | Uchida et al. |
| 5,255,016 A | 10/1993 | Usui et al. |
| 5,258,774 A | 11/1993 | Rogers |
| 5,278,585 A | 1/1994 | Karz et al. |
| 5,308,442 A | 5/1994 | Taub et al. |
| 5,317,869 A | 6/1994 | Takeuchi |
| 5,345,403 A | 9/1994 | Ogawa et al. |
| 5,358,231 A | 10/1994 | Andela |
| 5,364,196 A | 11/1994 | Baitz |
| 5,364,496 A | 11/1994 | Bollinger |
| 5,397,628 A | 3/1995 | Crawley et al. |
| 5,406,318 A | 4/1995 | Moore et al. |
| 5,443,320 A | 8/1995 | Agata et al. |
| 5,447,442 A | 9/1995 | Swart |
| 5,448,270 A | 9/1995 | Osborne |
| 5,459,501 A | 10/1995 | Lee et al. |
| 5,477,238 A | 12/1995 | Aharanson et al. |
| 5,494,698 A | 2/1996 | White et al. |
| 5,508,236 A | 4/1996 | Chiang et al. |
| 5,513,431 A | 5/1996 | Ohno et al. |
| 5,519,191 A | 5/1996 | Ketcham et al. |
| 5,530,792 A | 6/1996 | Ikeda et al. |
| 5,546,514 A | 8/1996 | Nishiyama |
| 5,552,812 A | 9/1996 | Ebinuma et al. |
| 5,565,113 A | 10/1996 | Hadimioglu et al. |
| 5,565,900 A | 10/1996 | Cowger et al. |
| 5,581,284 A | 12/1996 | Hermanson |
| 5,585,792 A | 12/1996 | Liu et al. |
| 5,605,659 A | 2/1997 | Moynihan et al. |
| 5,612,723 A | 3/1997 | Shimura et al. |
| 5,621,524 A | 4/1997 | Mitani |
| 5,635,966 A | 6/1997 | Keefe et al. |
| 5,635,968 A | 6/1997 | Bhaskar et al. |
| 5,638,103 A | 6/1997 | Obata et al. |
| 5,640,183 A | 6/1997 | Hackleman |
| 5,646,658 A | 7/1997 | Thiel et al. |
| 5,659,345 A | 8/1997 | Altendorf |
| 5,665,249 A | 9/1997 | Burke et al. |
| 5,666,141 A | 9/1997 | Matoba et al. |
| 5,675,719 A | 10/1997 | Matias et al. |
| 5,675,811 A | 10/1997 | Broedner et al. |
| 5,675,813 A | 10/1997 | Holmdahl |
| 5,676,475 A | 10/1997 | Dull |
| 5,684,519 A | 11/1997 | Matoba et al. |
| 5,697,144 A | 12/1997 | Mitani et al. |
| 5,719,602 A | 2/1998 | Hackleman et al. |
| 5,719,604 A | 2/1998 | Inui et al. |
| 5,726,693 A | 3/1998 | Sharma et al. |
| 5,738,454 A | 4/1998 | Zepeda |
| 5,738,799 A | 4/1998 | Hawkins et al. |
| 5,752,049 A | 5/1998 | Lee |
| 5,752,303 A | 5/1998 | Thiel |
| 5,757,407 A | 5/1998 | Rezanka |
| 5,771,054 A | 6/1998 | Dudek et al. |
| 5,781,202 A | 7/1998 | Silverbrook et al. |
| 5,781,331 A | 7/1998 | Carr et al. |
| 5,790,154 A | 8/1998 | Mitani et al. |
| 5,801,727 A | 9/1998 | Torpey |
| 5,802,686 A | 9/1998 | Shimada et al. |
| 5,804,083 A | 9/1998 | Ishii et al. |
| 5,812,159 A | 9/1998 | Anagnostopoulos et al. |
| 5,821,962 A | 10/1998 | Kudo et al. |
| 5,825,275 A | 10/1998 | Wuttig et al. |
| 5,828,394 A | 10/1998 | Khuri-Yakub et al. |
| 5,838,351 A | 11/1998 | Weber et al. |
| 5,841,452 A | 11/1998 | Silverbrook |
| 5,845,144 A | 12/1998 | Tateyama |
| 5,850,240 A | 12/1998 | Kubatzki et al. |
| 5,850,242 A | 12/1998 | Asaba |
| 5,851,412 A | 12/1998 | Kubby |
| 5,872,582 A | 2/1999 | Pan |
| 5,877,580 A | 3/1999 | Swierkowski |
| 5,883,650 A | 3/1999 | Figueredo |
| 5,889,541 A | 3/1999 | Bobrow et al. |
| 5,896,155 A | 4/1999 | Lebens |
| 5,897,789 A | 4/1999 | Weber |
| 5,903,380 A | 5/1999 | Motamedi et al. |
| 5,909,230 A | 6/1999 | Choi et al. |
| 5,912,684 A | 6/1999 | Fujii et al. |
| 5,940,096 A | 8/1999 | Komplin et al. |
| 5,980,719 A | 11/1999 | Cherukuri et al. |
| 5,994,816 A | 11/1999 | Dhuler et al. |
| 6,000,781 A | 12/1999 | Akiyama et al. |
| 6,003,668 A | 12/1999 | Joyce et al. |
| 6,003,977 A | 12/1999 | Weber et al. |

| | | | | | | |
|---|---|---|---|---|---|---|
| 6,007,187 | A | 12/1999 | Kashino et al. | 6,416,168 B1 | 7/2002 | Silverbrook |
| 6,019,457 | A | 2/2000 | Silverbrook | 6,426,014 B1 | 7/2002 | Silverbrook |
| 6,022,099 | A | 2/2000 | Chwalek et al. | 6,435,667 B1 | 8/2002 | Silverbrook |
| 6,022,104 | A | 2/2000 | Lin et al. | 6,443,555 B1 | 9/2002 | Silverbrook et al. |
| 6,022,482 | A | 2/2000 | Chen et al. | 6,451,216 B1 | 9/2002 | Silverbrook |
| 6,027,205 | A | 2/2000 | Herbert | 6,452,588 B2 | 9/2002 | Griffin et al. |
| 6,041,600 | A | 3/2000 | Silverbrook | 6,464,415 B1 | 10/2002 | Vaghi |
| 6,062,681 | A | 5/2000 | Field et al. | 6,467,870 B2 | 10/2002 | Matsumoto et al. |
| 6,067,797 | A | 5/2000 | Silverbrook | 6,471,336 B2 | 10/2002 | Silverbrook |
| 6,068,367 | A | 5/2000 | Fabbri | 6,474,882 B1 | 11/2002 | Vaghi |
| 6,070,967 | A | 6/2000 | Bern | 6,477,794 B1 | 11/2002 | Hoffmann |
| 6,074,043 | A | 6/2000 | Ahn | 6,485,123 B2 | 11/2002 | Silverbrook |
| 6,076,913 | A | 6/2000 | Garcia et al. | 6,488,358 B2 | 12/2002 | Silverbrook et al. |
| 6,079,821 | A | 6/2000 | Chwalek | 6,488,359 B2 | 12/2002 | Silverbrook |
| 6,084,609 | A | 7/2000 | Manini et al. | 6,488,360 B2 | 12/2002 | Silverbrook |
| 6,087,638 | A | 7/2000 | Silverbrook | 6,502,306 B2 | 1/2003 | Silverbrook |
| 6,092,889 | A | 7/2000 | Nakamoto et al. | 6,505,912 B2 | 1/2003 | Silverbrook et al. |
| 6,106,115 | A | 8/2000 | Mueller et al. | 6,513,908 B2 | 2/2003 | Silverbrook |
| 6,120,124 | A | 9/2000 | Atobe et al. | 6,536,874 B1 | 3/2003 | Silverbrook |
| 6,123,316 | A | 9/2000 | Biegelsen et al. | 6,540,332 B2 | 4/2003 | Silverbrook |
| 6,126,846 | A | 10/2000 | Silverbrook | 6,555,201 B1 | 4/2003 | Dhuler et al. |
| 6,130,967 | A | 10/2000 | Lee et al. | 6,561,627 B2 | 5/2003 | Jarrold et al. |
| 6,143,432 | A | 11/2000 | de Rochemont et al. | 6,561,635 B1 | 5/2003 | Wen |
| 6,151,049 | A | 11/2000 | Karita et al. | 6,582,059 B2 | 6/2003 | Silverbrook |
| 6,155,676 | A | 12/2000 | Etheridge, III et al. | 6,588,882 B2 | 7/2003 | Silverbrook |
| 6,171,875 | B1 | 1/2001 | Silverbrook | 6,598,960 B1 | 7/2003 | Cabal et al. |
| 6,174,050 | B1 | 1/2001 | Kashino et al. | 6,639,488 B2 | 10/2003 | Deligianni |
| 6,180,427 | B1 | 1/2001 | Silverbrook | 6,641,315 B2 | 11/2003 | King et al. |
| 6,183,067 | B1 | 2/2001 | Matta | 6,644,767 B2 | 11/2003 | Silverbrook |
| 6,188,415 | B1 | 2/2001 | Silverbrook | 6,644,786 B1 | 11/2003 | Lebens |
| 6,191,405 | B1 | 2/2001 | Mishima | 6,666,543 B2 | 12/2003 | Silverbrook |
| 6,209,989 | B1 | 4/2001 | Silverbrook | 6,669,332 B2 | 12/2003 | Silverbrook |
| 6,211,598 | B1 | 4/2001 | Dhuler et al. | 6,669,333 B1 | 12/2003 | Silverbrook |
| 6,213,589 | B1 | 4/2001 | Silverbrook | 6,672,706 B2 | 1/2004 | Silverbrook |
| 6,217,183 | B1 | 4/2001 | Shipman | 6,679,584 B2 | 1/2004 | Silverbrook |
| 6,220,694 | B1 | 4/2001 | Silverbrook | 6,682,174 B2 | 1/2004 | Silverbrook |
| 6,228,668 | B1 | 5/2001 | Silverbrook | 6,685,302 B2 | 2/2004 | Haluzak et al. |
| 6,229,622 | B1 | 5/2001 | Takeda | 6,685,303 B1 | 2/2004 | Trauernicht et al. |
| 6,231,772 | B1 | 5/2001 | Silverbrook | 6,715,949 B1 | 4/2004 | Fisher et al. |
| 6,234,472 | B1 | 5/2001 | Juan | 6,720,851 B2 | 4/2004 | Hallbjorner et al. |
| 6,234,608 | B1 | 5/2001 | Genovese | 6,783,217 B2 | 8/2004 | Silverbrook |
| 6,238,040 | B1 | 5/2001 | Silverbrook | 6,786,570 B2 | 9/2004 | Silverbrook |
| 6,238,113 | B1 | 5/2001 | Dodge | 6,786,661 B2 | 9/2004 | King et al. |
| 6,239,821 | B1 | 5/2001 | Silverbrook | 6,792,754 B2 | 9/2004 | Silverbrook |
| 6,241,906 | B1 | 6/2001 | Silverbrook | 6,808,325 B2 | 10/2004 | King et al. |
| 6,243,113 | B1 | 6/2001 | Silverbrook | 6,824,251 B2 | 11/2004 | Silverbrook |
| 6,244,691 | B1 | 6/2001 | Silverbrook | 6,830,395 B2 | 12/2004 | King et al. |
| 6,245,246 | B1 | 6/2001 | Silverbrook | 6,832,828 B2 | 12/2004 | Silverbrook |
| 6,245,247 | B1 | 6/2001 | Silverbrook | 6,834,939 B2 | 12/2004 | Silverbrook |
| 6,247,789 | B1 | 6/2001 | Sanada | 6,840,600 B2 | 1/2005 | Silverbrook |
| 6,247,790 | B1 | 6/2001 | Silverbrook | 6,848,780 B2 | 2/2005 | Silverbrook |
| 6,247,791 | B1 | 6/2001 | Silverbrook | 6,855,264 B1 | 2/2005 | Silverbrook |
| 6,247,792 | B1 | 6/2001 | Silverbrook | 6,857,724 B2 | 2/2005 | Silverbrook |
| 6,247,795 | B1 | 6/2001 | Silverbrook | 6,857,730 B2 | 2/2005 | Silverbrook |
| 6,247,796 | B1 | 6/2001 | Silverbrook | 6,866,369 B2 | 3/2005 | Silverbrook |
| 6,254,793 | B1 | 7/2001 | Silverbrook | 6,874,866 B2 | 4/2005 | Silverbrook |
| 6,258,285 | B1 | 7/2001 | Silverbrook | 6,880,918 B2 | 4/2005 | Silverbrook |
| 6,264,849 | B1 | 7/2001 | Silverbrook | 6,886,917 B2 | 5/2005 | Silverbrook et al. |
| 6,267,904 | B1 | 7/2001 | Silverbrook | 6,886,918 B2 | 5/2005 | Silverbrook et al. |
| 6,274,056 | B1 | 8/2001 | Silverbrook | 6,913,346 B2 | 7/2005 | Silverbrook |
| 6,283,582 | B1 | 9/2001 | Silverbrook | 6,916,082 B2 | 7/2005 | Silverbrook |
| 6,290,332 | B1 | 9/2001 | Crystal et al. | 6,918,707 B2 | 7/2005 | King et al. |
| 6,290,862 | B1 | 9/2001 | Silverbrook | 6,921,221 B2 | 7/2005 | King |
| 6,294,101 | B1 | 9/2001 | Silverbrook | 6,923,583 B2 | 8/2005 | King et al. |
| 6,294,347 | B1 | 9/2001 | Peltz et al. | 6,929,352 B2 | 8/2005 | Silverbrook |
| 6,297,577 | B1 | 10/2001 | Hotomi et al. | 6,932,459 B2 | 8/2005 | Silverbrook |
| 6,302,528 | B1 | 10/2001 | Silverbrook | 6,945,630 B2 | 9/2005 | Silverbrook |
| 6,305,773 | B1 | 10/2001 | Burr et al. | 6,948,799 B2 | 9/2005 | Silverbrook |
| 6,306,671 | B1 | 10/2001 | Silverbrook | 6,953,295 B2 | 10/2005 | King et al. |
| 6,312,099 | B1 | 11/2001 | Hawkins et al. | 6,959,981 B2 | 11/2005 | Silverbrook |
| 6,315,470 | B1 | 11/2001 | Vaghi | 6,966,625 B2 | 11/2005 | Silverbrook |
| 6,322,195 | B1 | 11/2001 | Silverbrook | 6,969,153 B2 | 11/2005 | Silverbrook et al. |
| 6,331,043 | B1 | 12/2001 | Shimazu | 6,979,075 B2 | 12/2005 | Silverbrook et al. |
| 6,331,258 | B1 | 12/2001 | Silverbrook | 6,986,613 B2 | 1/2006 | King et al. |
| 6,341,845 | B1 | 1/2002 | Scheffelin et al. | 6,988,787 B2 | 1/2006 | Silverbrook |
| 6,352,337 | B1 | 3/2002 | Sharma | 6,988,788 B2 | 1/2006 | Silverbrook |
| 6,357,115 | B1 | 3/2002 | Takatsuka et al. | 6,988,841 B2 | 1/2006 | King et al. |
| 6,361,230 | B1 | 3/2002 | Crystal et al. | 6,994,420 B2 | 2/2006 | Silverbrook |
| 6,416,167 | B1 | 7/2002 | Silverbrook | 7,004,566 B2 | 2/2006 | Silverbrook |

| | | |
|---|---|---|
| 7,008,046 B2 | 3/2006 | Silverbrook |
| 7,011,390 B2 | 3/2006 | Silverbrook et al. |
| 7,055,934 B2 | 6/2006 | Silverbrook |
| 7,055,935 B2 | 6/2006 | Silverbrook |
| 7,077,507 B2 | 7/2006 | Silverbrook |
| 7,077,588 B2 | 7/2006 | King et al. |
| 7,083,264 B2 | 8/2006 | Silverbrook |
| 7,090,337 B2 | 8/2006 | Silverbrook |
| 7,101,096 B2 | 9/2006 | Sasai et al. |
| 7,111,925 B2 | 9/2006 | Silverbrook |
| 7,131,715 B2 | 11/2006 | Silverbrook |
| 7,134,745 B2 | 11/2006 | Silverbrook |
| 7,144,098 B2 | 12/2006 | Silverbrook |
| 7,147,302 B2 | 12/2006 | Silverbrook |
| 7,147,303 B2 | 12/2006 | Silverbrook |
| 7,147,305 B2 | 12/2006 | Silverbrook et al. |
| 7,147,791 B2 | 12/2006 | Silverbrook |
| 7,156,494 B2 | 1/2007 | Silverbrook |
| 7,179,395 B2 | 2/2007 | Silverbrook et al. |
| 7,182,436 B2 | 2/2007 | Silverbrook et al. |
| 7,188,933 B2 | 3/2007 | Silverbrook et al. |
| 7,195,339 B2 | 3/2007 | Silverbrook |
| 7,217,048 B2 | 5/2007 | King et al. |
| 7,246,883 B2 | 7/2007 | Silverbrook |
| 7,264,335 B2 | 9/2007 | Silverbrook et al. |
| 7,270,492 B2 | 9/2007 | King et al. |
| 7,278,711 B2 | 10/2007 | Silverbrook |
| 7,278,712 B2 | 10/2007 | Silverbrook |
| 7,278,796 B2 | 10/2007 | King et al. |
| 7,284,838 B2 | 10/2007 | Silverbrook |
| 7,303,254 B2 | 12/2007 | Silverbrook |
| 7,322,679 B2 | 1/2008 | Silverbrook |
| 7,334,873 B2 | 2/2008 | Silverbrook |
| 7,347,536 B2 | 3/2008 | Silverbrook et al. |
| 7,367,729 B2 | 5/2008 | King et al. |
| 7,401,902 B2 | 7/2008 | Silverbrook |
| 7,416,282 B2 | 8/2008 | Silverbrook |
| 7,438,391 B2 | 10/2008 | Silverbrook et al. |
| 7,465,027 B2 | 12/2008 | Silverbrook |
| 7,465,029 B2 | 12/2008 | Silverbrook et al. |
| 7,465,030 B2 | 12/2008 | Silverbrook |
| 7,467,855 B2 | 12/2008 | Silverbrook |
| 7,470,003 B2 | 12/2008 | Silverbrook |
| 7,506,965 B2 | 3/2009 | Silverbrook |
| 7,506,969 B2 * | 3/2009 | Silverbrook .................. 347/56 |
| 7,520,593 B2 | 4/2009 | Silverbrook et al. |
| 7,520,594 B2 | 4/2009 | Silverbrook |
| 7,537,301 B2 | 5/2009 | Silverbrook |
| 7,537,314 B2 | 5/2009 | Silverbrook |
| 7,556,351 B2 | 7/2009 | Silverbrook |
| 7,578,582 B2 | 8/2009 | Silverbrook |
| 7,780,269 B2 * | 8/2010 | Silverbrook .................. 347/56 |
| 2001/0000447 A1 | 4/2001 | Thompson |
| 2001/0006394 A1 | 7/2001 | Silverbrook |
| 2001/0007461 A1 | 7/2001 | Silverbrook |
| 2001/0008406 A1 | 7/2001 | Silverbrook |
| 2001/0008409 A1 | 7/2001 | Silverbrook |
| 2001/0009430 A1 | 7/2001 | Silverbrook |
| 2001/0017089 A1 | 8/2001 | Fujii et al. |
| 2001/0024590 A1 | 9/2001 | Woodman et al. |
| 2002/0180834 A1 | 12/2002 | Silverbrook |
| 2003/0095726 A1 | 5/2003 | Kia et al. |
| 2003/0103106 A1 | 6/2003 | Silverbrook |
| 2003/0103109 A1 | 6/2003 | Silverbrook |
| 2003/0231227 A1 | 12/2003 | Kim |
| 2004/0070648 A1 | 4/2004 | Silverbrook |
| 2004/0088468 A1 | 5/2004 | Hasegawa |
| 2004/0095436 A1 | 5/2004 | Silverbrook |
| 2004/0257403 A1 | 12/2004 | Silverbrook |
| 2005/0128252 A1 | 6/2005 | Silverbrook |
| 2005/0140727 A1 | 6/2005 | Silverbrook |
| 2005/0226668 A1 | 10/2005 | King et al. |
| 2005/0232676 A1 | 10/2005 | King et al. |
| 2007/0097194 A1 | 5/2007 | Silverbrook |
| 2008/0204514 A1 | 8/2008 | Silverbrook |
| 2008/0316269 A1 | 12/2008 | Silverbrook et al. |

FOREIGN PATENT DOCUMENTS

| | | |
|---|---|---|
| DE | 1648322 A1 | 3/1971 |
| DE | 2905063 A | 8/1980 |
| DE | 2905063 A1 | 8/1980 |
| DE | 3245283 A | 6/1984 |
| DE | 3430155 A | 2/1986 |
| DE | 8802281 U1 | 5/1988 |
| DE | 3716996 A | 12/1988 |
| DE | 3716996 A1 | 12/1988 |
| DE | 3934280 A | 4/1990 |
| DE | 4031248 A1 | 4/1992 |
| DE | 4328433 A | 3/1995 |
| DE | 19516997 A | 11/1995 |
| DE | 19516997 A1 | 11/1995 |
| DE | 19517969 A | 11/1995 |
| DE | 19517969 A1 | 11/1995 |
| DE | 19532913 A | 3/1996 |
| DE | 19623620 A1 | 12/1996 |
| DE | 19639717 A | 4/1997 |
| DE | 19639717 A1 | 4/1997 |
| EP | 0092229 A | 10/1983 |
| EP | 0398031 A | 11/1990 |
| EP | 0416540 A2 | 3/1991 |
| EP | 0427291 A | 5/1991 |
| EP | 0431338 A | 6/1991 |
| EP | 04-118241 A | 4/1992 |
| EP | 0478956 A | 4/1992 |
| EP | 0506232 A | 9/1992 |
| EP | 0510648 A | 10/1992 |
| EP | 0627314 A | 12/1994 |
| EP | 0634273 A | 1/1995 |
| EP | 0634273 A2 | 1/1995 |
| EP | 0713774 A2 | 5/1996 |
| EP | 0737580 A | 10/1996 |
| EP | 0750993 A | 1/1997 |
| EP | 0882590 A | 12/1998 |
| FR | 2231076 A | 12/1974 |
| GB | 792145 A | 3/1958 |
| GB | 1428239 A | 3/1976 |
| GB | 2227020 A | 7/1990 |
| GB | 2262152 A | 6/1993 |
| JP | 56-010472 | 2/1981 |
| JP | 58-112747 A | 7/1983 |
| JP | 58-116165 A | 7/1983 |
| JP | 61-025849 A | 2/1986 |
| JP | 61-268453 A | 11/1986 |
| JP | 01-048124 A | 2/1989 |
| JP | 01-105746 A | 4/1989 |
| JP | 01-115639 A | 5/1989 |
| JP | 01-115693 A | 5/1989 |
| JP | 01-128839 A | 5/1989 |
| JP | 01-257058 A | 10/1989 |
| JP | 01-306254 A | 12/1989 |
| JP | 02-030543 A | 1/1990 |
| JP | 02-050841 A | 2/1990 |
| JP | 02-092643 A | 4/1990 |
| JP | 02-108544 A | 4/1990 |
| JP | 02-158348 A | 6/1990 |
| JP | 02-162049 A | 6/1990 |
| JP | 02-265752 A | 10/1990 |
| JP | 03-009846 | 1/1991 |
| JP | 03-009846 A | 1/1991 |
| JP | 03-065348 A | 3/1991 |
| JP | 0416540 | 3/1991 |
| JP | 03-112662 A | 5/1991 |
| JP | 03-153359 A | 7/1991 |
| JP | 403153359 A | 7/1991 |
| JP | 03-180350 A | 8/1991 |
| JP | 03-213346 A | 9/1991 |
| JP | 403292147 A | 12/1991 |
| JP | 04-001051 | 1/1992 |
| JP | 04-001051 A | 1/1992 |
| JP | 04-126255 A | 4/1992 |
| JP | 04-141429 A | 5/1992 |
| JP | 404325257 | 11/1992 |
| JP | 404325257 A | 11/1992 |
| JP | 04-353458 A | 12/1992 |
| JP | 04-368851 A | 12/1992 |
| JP | 05-108278 | 4/1993 |

| | | |
|---|---|---|
| JP | 05-284765 A | 10/1993 |
| JP | 05-318724 A | 12/1993 |
| JP | 405318724 | 12/1993 |
| JP | 06-091865 A | 4/1994 |
| JP | 06-091866 A | 4/1994 |
| JP | 07-125241 A | 5/1995 |
| JP | 07-314665 A | 12/1995 |
| JP | 08-142323 | 6/1996 |
| JP | 08-336965 | 12/1996 |
| JP | 411034328 A | 2/1999 |
| JP | 11212703 A | 8/1999 |
| WO | WO 94/18010 A | 8/1994 |
| WO | WO 96/32260 | 10/1996 |
| WO | WO 96/32283 | 10/1996 |
| WO | WO 97/12689 A | 4/1997 |
| WO | WO 99/03681 | 1/1999 |
| WO | WO 99/03681 A1 | 1/1999 |

OTHER PUBLICATIONS

Noworolski J M et al: "Process for in-plane and out-of-plane single-crystal-silicon thermal microactuators" Sensors and Actuators A, Ch. Elsevier Sequoia S.A., Lausane, vol. 55, No. 1, Jul. 15, 1996, pp. 65-69, XP004077979.

Smith et al., "Ink Jet Pump" IBM Technical Disclosure Bulletin, vol. 20, No. 2, Jul. 1977, pp. 560-562.

Wolf, Stanley, "Silicon Processing for the VLSI Era: Colume 1 Process Technology" 2nd Edition, 2000 pp. 489.

Yamagata, Yutaka et al, "A Micro Mobile Mechanism Using Thermal Expansion and its Theoretical Analysis". Proceedings of the workshop on micro electro mechanical systems (MEMS), US, New York, IEEE, vol. Workshop 7, Jan. 25, 1994, pp. 142-147, XP000528408, ISBN: 0-7803-1834-X.

* cited by examiner

EJECTION NOZZLE ASSEMBLY

CROSS REFERENCES TO RELATED APPLICATIONS

The present application is a Continuation of U.S. application Ser. No. 12/368,997 filed Feb. 11, 2009, now issued U.S. Pat. No. 7,780,269, which is a Continuation of U.S. application Ser. No. 11/707,039 filed 16 Feb. 2007, now issued U.S. Pat. No. 7,506,969, which is a Continuation of U.S. application Ser. No. 11/484,745 filed on Jul. 12, 2006, now issued as U.S. Pat. No. 7,195,339, which is a Continuation of U.S. application Ser. No. 11/185,721 filed on Jul. 21, 2005, now issued as U.S. Pat. No. 7,083,263, which is a Continuation of U.S. application Ser. No. 10/713,084 filed on Nov. 17, 2003, now issued as U.S. Pat. No. 7,066,574, which is a Continuation of U.S. application Ser. No. 10/401,987 filed on Mar. 31, 2003, now issued as U.S. Pat. No. 6,663,225, which is a Continuation of U.S. application Ser. No. 09/864,332 filed on May 25, 2001, now issued as U.S. Pat. No. 6,540,331, which is a Continuation-In-Part of U.S. application Ser. No. 09/112,767 filed on Jul. 10, 1998, now issued as U.S. Pat. No. 6,416,167, the entire contents of which are herein incorporated by reference.

FIELD OF THE INVENTION

This invention relates to a micro-electromechanical device having actuator guide formations.

BACKGROUND OF THE INVENTION

The applicant has invented a page width printhead which is capable of generating text and images of a resolution as high as 1600 dpi.

The printheads are manufactured in accordance with a technique that is based on integrated circuit fabrication. An example of such a technique is that which is presently used for the fabrication of micro-electromechanical systems.

These fabrication techniques allow the printhead to incorporate up to 84000 nozzle arrangements. The nozzle arrangements are electromechanically operated to achieve the ejection of ink.

In a number of the Applicant's inventions, the nozzle arrangements incorporate thermally actuated devices which are displaceable within nozzle chambers to eject the ink from the nozzle chambers. Many of the thermal actuators use a combination of materials and a bending action which results from an uneven expansion of the materials. The thermal actuators are manufactured by depositing consecutive layers of material having different coefficients of thermal expansion.

The present invention was conceived to address certain problems associated with such actuators. A significant problem with such actuators is that the different materials can result in bending and bending stresses being set up in the thermal actuator when the thermal actuator is inoperative and exposed to transient conditions. As is known in the field of integrated circuit fabrication, the deposition of material results in a heating of both the material being deposited and the material on which the deposition takes place. The fact that the materials have different thermal expansion characteristics can result in the bending of the laminated structure upon cooling. This is also the case where the materials have different elasticity characteristics. Those skilled in the field of micro electro-mechanical systems fabrication will appreciate that this is highly undesirable.

SUMMARY OF THE INVENTION

According to a first aspect of the invention, there is provided a micro-electromechanical device which comprises
a substrate containing drive circuitry; and
an elongate actuator that is fast with the substrate at a fixed end, the elongate actuator having a laminated structure of at least one inner layer and a pair of opposed, outer layers, the outer layers having substantially the same thermal expansion and elasticity characteristics, with one of the outer layers defining an electrical heating circuit that is in electrical contact with the drive circuitry to be heated and to expand on receipt of an electrical signal from the drive circuitry and to cool and contract on termination of the signal, thereby to generate reciprocal movement of the actuator.

The actuator may have a single inner layer.

The outer layers may have a higher coefficient of thermal expansion than the inner layer.

According to a second aspect of the invention, there is provided a micro-electromechanical device which comprises
a substrate containing drive circuitry; and
a plurality of elongate actuators, each actuator being fast with the substrate at a fixed end, each elongate actuator having a laminated structure of at least three layers in the form of a pair of opposed, outer layers and at least one inner layer, the outer layers having substantially the same thermal expansion and elasticity characteristics, with one of the outer layers defining an electrical heating circuit that is in electrical contact with the drive circuitry to be heated and to expand on receipt of an electrical signal from the drive circuitry and to cool and contract on termination of the signal, thereby to generate reciprocal movement of the actuator.

According to a third aspect of the invention, there is provided a fluid ejecting device which comprises
a substrate containing drive circuitry,
nozzle chamber walls and a roof wall positioned on the substrate to define a nozzle chamber in which fluid is received and a fluid ejection port from which the fluid is ejected, in use;
a fluid ejecting mechanism that is operatively arranged with respect to the nozzle chamber to act on the fluid in the nozzle chamber to eject fluid from the fluid ejection port;
a thermal bend actuator that is connected to the drive circuitry to receive an electrical signal from the drive circuitry and to provide actuation of the fluid ejecting mechanism, wherein
the thermal bend actuator has a laminated structure of at least three layers in the form of a pair of opposed, outer layers and at least one inner layer, the outer layers having substantially the same thermal expansion and elasticity characteristics.

The thermal bend actuator may have a single inner layer.

The outer layers of the thermal bend actuator may each be conductive.

At least one of the outer layers of the thermal bend actuator may be connected to the drive circuitry so that said at least one of the outer layers can be heated.

The outer layers may have a higher coefficient of thermal expansion than the inner layer.

DETAILED DESCRIPTION OF THE INVENTION

Figure 1:
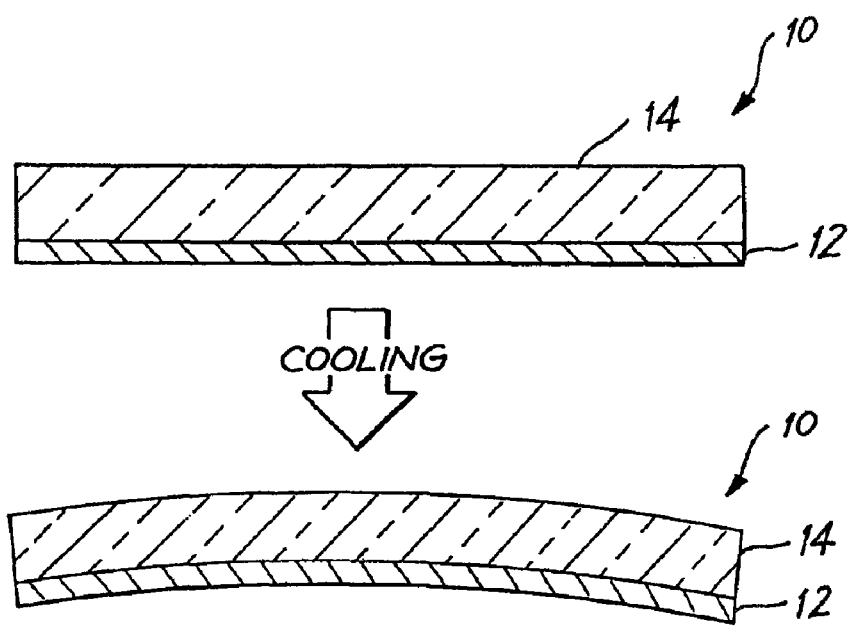
FIG. 1 shows two conditions of a thermal bend actuator of a fluid ejection device, not in accordance with the invention, and indicating the problem associated with such thermal bend actuators.

In FIG. 1, reference numeral 10 generally indicates an actuating mechanism in the form of a bi-layer thermal bend actuator.

As set out above, the device in which the thermal bend actuator 10 is to be incorporated is formed as part of an integrated circuit fabrication process. It follows that the thermal actuator 10 is manufactured in a deposition and etching process. Thus, once a first layer 12 has been deposited and prepared, a second layer 14 is deposited on the first layer 12. In order to operate correctly, one of the layers, in this case the first layer 14 is of a material having a higher coefficient of thermal expansion than the material of the second layer 12.

As is well known in the field of integrated circuit fabrication, deposition of material occurs at a temperature which is, of necessity, significantly higher than ambient temperature. This results in a heating of the first layer 12 and the deposited second layer 14.

Also, in order to operate, the layers 12, 14 are of materials which have different coefficients of thermal expansion. It follows that, upon cooling after deposition, thermal stresses are set up between the layers 12, 14 which can cause bending of the actuator 10. This is extremely undesirable, particularly in light of the fact that the actuators are manufactured on a micro-electromechanical scale.

Figure 2:
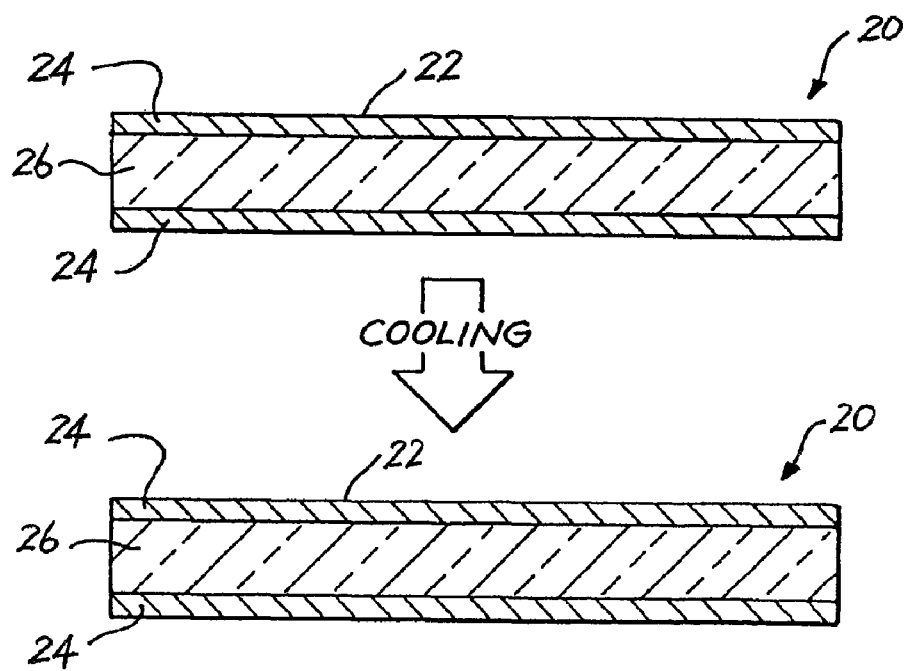
FIG. 2 shows a schematic view of a thermal bend actuator of a fluid ejection device, in accordance with the invention, and, in particular, the advantage associated with such a thermal bend actuator.

In FIG. 2, reference numeral 20 generally indicates an actuator mechanism of a fluid ejection device, in accordance with the invention.

The actuator mechanism 20 includes a thermal bend actuator 22 which has three layers in the form of a pair of opposed outer layers 24 and an inner layer 26.

The outer layers 24 are of substantially the same material and are of substantially the same dimensions. Further, the outer layers 24 are each conductive.

The outer layers 24 are of a material having a coefficient of thermal expansion which is such that, upon heating of any one of the layers 24, the actuator 22 bends to a degree sufficient to perform work. In particular, the outer layers 24 can be of any material having a suitable Young's modulus and coefficient of thermal expansion. Possible materials are titanium nitride and a copper nickel alloy.

The inner layer 26 can be any suitable insulating material such as glass (amorphous silicon dioxide) or even air.

It will be appreciated that the thermal bend actuator 22 will find application in any micro electro-mechanical system in which a prime mover is required. Thus, at least one of the outer layers 24 is connectable to drive circuitry of such a micro electro-mechanical device.

Figure 3:
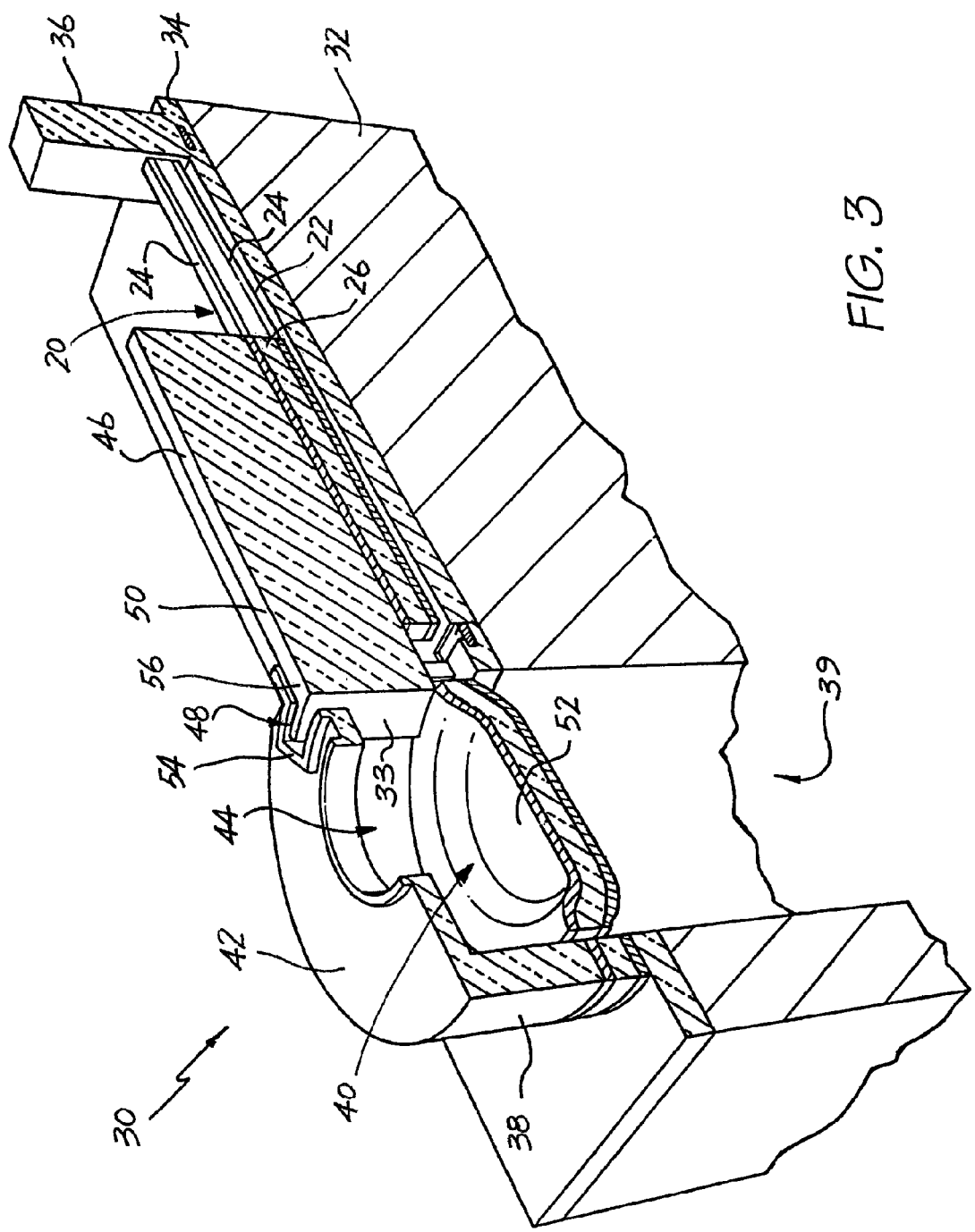
FIG. 3 shows a fluid ejection device in accordance with the invention.

In FIG. 3, reference numeral 30 generally indicates a fluid ejection device in accordance with the invention. In this embodiment, the fluid ejection device is in the form of a nozzle arrangement of an ink jet printhead, which includes the actuating mechanism 20.

It is to be appreciated that reference to the nozzle arrangement 30 is for illustrative purposes and should not be construed as limiting the invention to this particular embodiment.

The nozzle arrangement 30 is formed on a wafer substrate 32 in a successive deposition and etching process which forms part of an integrated circuit fabrication technique conventionally used in the manufacture of micro electro-mechanical systems.

In this particular example, the nozzle arrangement 30 is formed on a drive circuitry layer 34 which, itself, is formed on the wafer substrate 32.

A support post 36 extends from the drive circuitry layer 34. The thermal bend actuator 22 is mounted, cantilever-fashion, on the support post 36. One of the outer layers 24 is in electrical contact with the drive circuitry layer 34 so that movement of the bend actuator 22 can be achieved with a control system (not shown) connected to the drive circuitry layer 34.

A cylindrical wall 38 is formed on the drive circuitry layer 34 to define a nozzle chamber 40. A roof wall 42 is arranged on the cylindrical wall 38 and defines an ink ejection port 44 from which ink is ejected out of the nozzle chamber 40. An ink ejection member 46 is mounted on the thermal bend actuator 22 and extends through a slot 48 defined in the cylindrical wall 38. The ink ejection member 46 includes an arm 50 and a paddle 52 mounted on the arm 50 and being shaped to correspond generally with a cross-sectional dimension of the nozzle chamber 40.

The slot 48 in the cylindrical wall 38 is shaped to define a guide formation 54 in the cylindrical wall 38. An end of the arm 50 on which the paddle 52 is mounted is shaped to correspond with the guide formation 54. In particular, the guide formation 54 and the end 56 of the arm 50 are shaped so that, on bending of the bend actuator 22, movement of the end 56 and hence the paddle 52 is retained along a linear path.

The nozzle arrangement 30 is one of a plurality of nozzle arrangements formed on the wafer substrate 32 to define the ink jet printhead of the invention. It is simply for reasons of clarity and ease of description that a single nozzle arrangement is shown in the accompanying drawings.

It will be appreciated that, due to the fact that each nozzle arrangement is a micro-electromechanical device and that up to 84000 such nozzle arrangements may be required for a single printhead, accuracy and consistency of manufacture of each nozzle arrangement is extremely important. It would therefore be highly disadvantageous if, upon cooling after deposition, the thermal bend actuator 22 became bent or warped. This would result in an uneven positioning of the paddles 52 within the nozzle chambers 40.

Applicant submits that the fact that the two opposed outer layers 24 have the same thermal expansion and elasticity characteristics results in stability of the bend actuator 22 upon cooling after deposition. In this manner, consistently straight bend actuators 22 can be achieved.

A further advantage that has been identified by the Applicant is that, in general operation, the substantially identical outer layers 24 of the thermal actuator 22 provide a high level of thermal stability. This allows the thermal actuator 22 to be operated repeatedly in spite of the fact that all the heat from previous activations has not yet dissipated.

The invention claimed is:
1. An ejection nozzle assembly comprising:
a substrate defining a supply passage for ejection fluid;
drive circuitry on the substrate;
a chamber on the drive circuitry and in fluid communication with the supply passage and an ejection port;

an ejection member disposed between the supply passage and the ejection port; and a heater element electrically coupled to the drive circuitry and the ejection member for causing ejection of the ejection fluid supplied via the supply passage from the ejection port.

2. An ejection nozzle assembly as claimed in claim 1, wherein the heater element comprises titanium nitride or copper nickel alloy material.

3. An ejection nozzle assembly as claimed in claim 1, further comprising an insulating element defined on the heater element, the insulating element comprising one of glass, amorphous silicon dioxide and any other like thermal insulating material.

4. An ejection nozzle assembly as claimed in claim 1, wherein the chamber comprises a cylindrical wall and a cover that defines the ejection port.

* * * * *